(12) United States Patent
Yuan et al.

(10) Patent No.: US 9,582,629 B2
(45) Date of Patent: Feb. 28, 2017

(54) METHODS OF GENERATING CIRCUIT LAYOUTS USING SELF-ALLIGNED DOUBLE PATTERNING (SADP) TECHNIQUES

(71) Applicant: GLOBALFOUNDRIES Inc., Grand Cayman (KY)

(72) Inventors: Lei Yuan, Cupertino, CA (US); Li Yang, San Jose, CA (US); Jongwook Kye, Pleasanton, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/245,868

(22) Filed: Apr. 4, 2014

(65) Prior Publication Data

US 2015/0286764 A1    Oct. 8, 2015

(51) Int. Cl.
*H01L 21/76* (2006.01)
*G06F 17/50* (2006.01)

(52) U.S. Cl.
CPC ...... *G06F 17/5072* (2013.01); *G06F 17/5077* (2013.01)

(58) Field of Classification Search
CPC ............. H01L 2924/00; H01L 27/0207; G06F 17/5068; G01F 17/5077
See application file for complete search history.

(56) References Cited

U.S. PATENT DOCUMENTS

| | | | | |
|---|---|---|---|---|
| 8,312,394 B2* | 11/2012 | Ban | ...... | G06F 17/5068 716/50 |
| 8,782,586 B2* | 7/2014 | Sezginer | ...... | G06F 17/5077 716/126 |
| 2013/0126978 A1* | 5/2013 | Becker | ...... | H01L 27/092 257/369 |
| 2015/0155198 A1* | 6/2015 | Tsai | ...... | H01L 21/76802 438/674 |
| 2015/0214367 A1* | 7/2015 | Chang | ...... | H01L 21/76897 257/401 |

* cited by examiner

*Primary Examiner* — Zandra Smith
*Assistant Examiner* — Andre' C Stevenson
(74) *Attorney, Agent, or Firm* — Williams Morgan, P.C.

(57) ABSTRACT

At least one method disclosed herein involves creating an overall pattern layout for an integrated circuit that is to be manufactured using a self-aligned double patterning (SADP) process, forming a first metal feature having a first width on a first track of a metal layer using the SADP process, forming a second metal feature having a second width on a second track of the metal layer. The second track is adjacent to the first track. The method also includes forming an electrical connection between the first metal feature and the second metal feature to provide an effectively single metal pattern having a third width that is the sum of the first and second widths, rendering the first and second features decomposable using the SADP process; and decomposing the overall pattern layout with the first and second metal features into a mandrel mask pattern and a block mask pattern.

9 Claims, 14 Drawing Sheets

0 = Mandrel Metal (Color A)
1 = Non-Mandrel Metal (Color B)

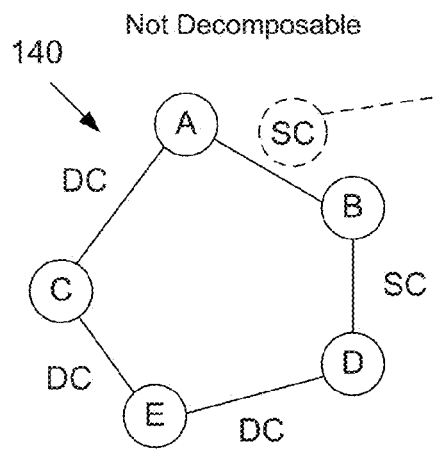
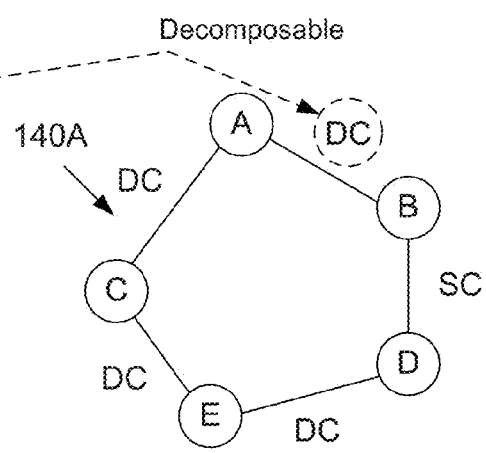
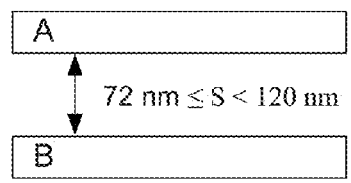
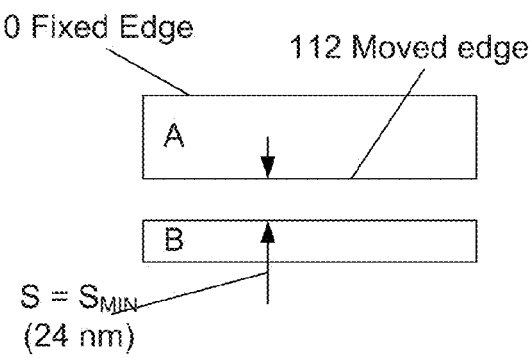
Figure 2C
Figure 2D
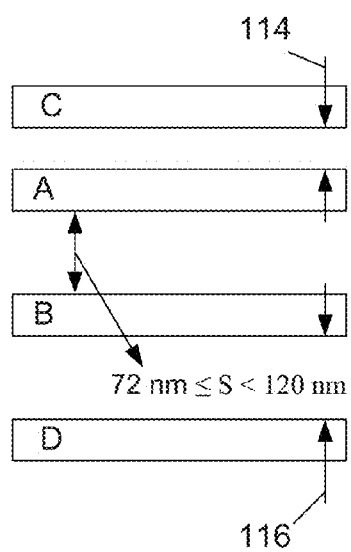
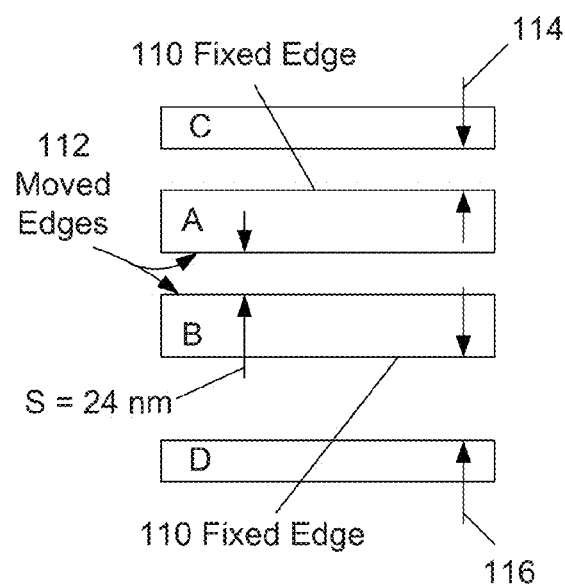
Figure 2E
Figure 2F

| Number of Tracks | Metal Width (nm) | |
|---|---|---|
| | Prior Art | Embodiments |
| 1 | 24 | Effectively 24 |
| 2 | 72 | Effectively 48 |
| 3 | 120 | Effectively 120 |
| 4 | 168 | Effectively 144 |
| 5 | 216 | Effectively 216 |
| 6 | 264 | Effectively 240 |

Forbidden
Allowed

METHODS OF GENERATING CIRCUIT LAYOUTS USING SELF-ALLIGNED DOUBLE PATTERNING (SADP) TECHNIQUES

BACKGROUND OF THE INVENTION

1. Field of the Invention

Generally, the present disclosure relates to the manufacture of sophisticated semiconductor devices, and, more specifically, to various methods of generating circuit layouts using self-aligned double patterning (SADP) techniques.

2. Description of the Related Art

There have been many advancements in the area of manufacturing of semiconductor devices. Various processes are performed on semiconductor substrates in manufacturing integrated circuit products. Photolithography is one of the basic processes used in manufacturing integrated circuit products. Generally, photolithography involves: (1) forming a layer of light or radiation-sensitive material, such as photoresist, above a layer of material or a substrate; (2) selectively exposing the radiation-sensitive material to a light generated by a light source (such as a DUV or EUV source) to transfer a pattern defined by a mask or reticle (interchangeable terms as used herein) to the radiation-sensitive material; and (3) developing the exposed layer of radiation-sensitive material to define a patterned mask layer. Various process operations, such as etching and/or ion implantation processes, may then be performed on the underlying layer of material or substrate through the patterned mask layer.

The ultimate goal in integrated circuit fabrication is to accurately reproduce the original circuit design on the integrated circuit product. Historically, the feature sizes and pitches employed in integrated circuit products were such that a desired pattern could be formed using a single patterned photoresist masking layer. However, in recent years, device dimensions and pitches have been reduced to the point where existing photolithography tools, e.g., 193 nm wavelength immersion photolithography tools, cannot form a single patterned mask layer with all of the features of the overall target pattern. Accordingly, device designers have resorted to techniques that involve performing multiple exposures to define a single target pattern in a layer of material. One such technique is generally referred to as multiple patterning, e.g., double patterning. Generally speaking, double patterning is an exposure method that involves splitting (i.e., dividing or separating) a dense overall target circuit pattern into two separate, less-dense patterns. The simplified, less-dense patterns are then printed separately on a wafer utilizing two separate masks (where one of the masks is utilized to image one of the less-dense patterns, and the other mask is utilized to image the other less-dense pattern). Further, in some cases, the second pattern s printed in between the lines of the first pattern such that the imaged wafer has, for example, a feature pitch which is half that found on either of the two less-dense masks. This technique effectively lowers the complexity of the photolithography process, improving the achievable resolution and enabling the printing of far smaller features than would otherwise be impossible using existing photolithography tools.

The Self-Aligned-Double-Patterning (SADP) process is one such multiple) technique. The SADP process may be an attractive solution for manufacturing next-generation devices, particularly metal routing lines on such next-generation devices, due to better overlay control that is possible when using an SADP process.

FIGS. 1A-1K depict one illustrative example: of a device 10 wherein an illustrative prior art SADP process was performed to form metal features, e.g. metal lines, in a layer of insulating material 12. With reference to FIG. 1A, a hard mask layer 14 is formed above the layer of insulating material 12 and a layer of mandrel material 16, such as poly silicon, was formed above the hard mask layer 14. Also depicted is a patterned layer of photoresist material 17, that was formed above the layer of mandrel material 16 using traditional, single exposure photolithography tools and techniques. The layer of mandrel material 16 may be comprised of a material that may be selectively etched with respect to the hard mask layer 14.

Next, as shown in FIG. 1B, an etching process is performed on the layer of mandrel material 16 while using the patterned layer of photoresist material 17 as an etch mask. This etching process results in the formation of a plurality of mandrels 16A. In the depicted example, the mandrels are formed so as to have a pitch 16P and a minimum width 16W. The pitch 16P and the width 16W may vary depending upon the particular device 10 under construction. FIG. 1C depicts the device 10 after the patterned layer of photoresist 17, i.e. the mandrel mask, has been removed.

Next, as shown in FIG. 1D, a layer of spacer material 18 was deposited on and around the mandrels 16A by performing a conformal deposition process. The layer of spacer material 18 should be a material that may be selectively etched relative to the mandrels 16A and the hard mask layer 14. FIG. 1E depicts the device 10 after an anisotropic etching process was performed on the layer of spacer material 18 to define a plurality of sidewall spacers 18A, having a lateral width 18W, positioned adjacent the mandrels 16A. The width 18W of the spacers 18A may vary depending upon the particular device 10 under construction. As an example, in order to form patterns with 1:1 ratio line and space, the width of the spacers 18A need equal to the width of the mandrel 16A. Next, as shown in FIG. 1F, the mandrels 16A are removed by performing an etching process that is selective relative to the hard mask layer 14 and the sidewall spacers 18A.

FIG. 10 depicts the device 10 after a patterned photoresist mask 20, a so-called block mask, is formed above the layer of spacers 18A and the hard mask layer 14. In one example, the block mask 20 may be formed using traditional, single exposure photolithography tools and techniques. FIG. 1H depicts the device 10 after an etching process has been performed to transfer the pattern defined by the combination (or union) of the sidewall spacers 18A and the block mask 20 to the hard mask layer 14. FIG. 1I depicts the device 10 after one or more process operations were performed to remove the sidewall spacers 18A and the block mask 20 from above the now-patterned hard mask layer 14. Next, as shown in FIG. 1J, an etching process was performed on the layer of insulating material 12 through the patterned hard mask 14 to define illustrative trenches 22 in the layer of insulating material 12. FIG. 1K depicts the device 10 after schematically depicted metal features 24, e.g., metal lines, were formed in the trenches 22 and after the patterned hard mask layer 14 was removed. The manner in which such metal features 24 may be formed in the layer of insulating material 12 are well known to those skilled in the art.

In the SADP process, the metal features 24 that are formed are typically referred to as the "mandrel-metal" features ("MM") or "non-mandrel-metal" features ("NMM"). As depicted in FIG. 1K, the al features 24 that are positioned under the location where the mandrels 16A and the features of the mandrel mask 17 (both shown in dashed lines in FIG. 1K) were located, are so-called "mandrel-metal" features designated as "MM" in FIG. 1K. All of the other metal features 24 formed in the layer of insulating material 12 are "non-mandrel-metal" features designated as "NMM" in FIG. 1K. As it relates to terminology, the MM features and NMM features are referred to as being different "colors" when it comes to decomposing an overall pattern layout that is intended to be manufactured using an SADP process, as will be described more fully below. Thus, two MM features are said to be of the "same color" and two NMM features are said to be of the "same color, while an MM feature and an NMM feature are said to be of "different colors."

To use double patterning techniques, an overall pattern layout for a circuit must be what is referred to as double patterning compliant. Double patterning compliant generally refers to an overall pattern layout being decomposed into two separate patterns, such that each may be formed using existing photolithography tools and other techniques. An overall pattern layout may have many regions or areas that cannot be directly printed because the plurality of closely spaced features in those regions are spaced too close to one another for existing photolithography tools to be able to such closely spaced features as individual feature. To the extent a particular region under investigation has an even number of such features, such a pattern is sometimes referred to as an "even cycle" pattern, while a region that has an odd number of features is sometimes referred to as an "odd cycle" pattern. "Even" cycle patterns can be formed using double patterning techniques, while "odd" cycle patterns cannot be formed using double patterning techniques.

One well-known double patterning technique is referred to as LELE ("litho-etch-litho-etch) double patterning. As the name implies, the LELE process involves forming two photoresist etch masks and performing two etching processes to transfer the desired overall pattern to a hard mask later that is then used as an each mask to etch an underlying layer of crial. With respect to terminology, the different masks employed in the LELE double patterning process are said to be different "colors." Thus, depending upon the spacing between adjacent features, the features may be formed using the same photoresist mask ("same color") or they may have to be formed using different photoresist masks ("different color"). In an LELE process, if two adjacent features are spaced apart by a distance that can be patterned using traditional single exposure photolithography, then those two adjacent features may be formed using the same ("same color") photoresist mask. In contrast, if the spacing between the two adjacent features is less than can be formed using single exposure photolithography, then those features must be either formed using different photoresist masks ("different color") or the spacing between the features must be increased by changing the circuit layout such that hey may be formed using the same photoresist mask.

As noted above, any circuit layout to be formed using double patterning techniques must be checked to confirm that it can be decomposed into two separate photoresist masks. A layout must have zero odd-cycles to be decomposable in an LELE process. To determine if a circuit layout is double-patterning compliant, a mask engineer, using very sophisticated and well-known computer programs, connects adjacent features by "drawing" a "polygon loop" that connects the centroid of the features under investigation. FIG. 1L, contains a simplistic example of such a polygon loop 30 drawn for live (A-E) adjacent features. The polygon loop 30 is comprised of five edges 31. In this example, due to the relative spacing between adjacent features, all of the features are required to be formed using "different color" ("DC") masks. Thus, the polygon loop 30 has five "DC" edges connecting the various features. The polygon loop 30 represents an odd-cycle layout due to the odd number of DC edge (five total) in the polygon loop 30. Due to the odd number of DC edges in the polygon loop 30, the pattern reflected by the polygon loop 30 is not decomposable using double pattering techniques.

The SADP odd cycle check is generally more complicated than the LELE odd cycle check due to the complicate SADP design rules. One example of an SADP design rule is shown in FIG. 1M. The example of FIG. 1M illustrates that when two features are spaced between 72 nm and 120 nm, they must be on same color, i.e., both of the features are either MM or NMM. This "must-on-same-color" spacing rule is SADP specific as, in LELE, two features that are separated by a distance larger than same color spacing rule can be put on either same mask or different masks. Correspondingly, a SADP polygon loop for odd cycle check will compose same color edge (SC). One example of SADP polygon loop 32 is shown in FIG. 1N, which consists of three different color (DC) edge and two same color (SC) edges and is not decomposable due to the odd number of DC edges.

In an LELE router, the odd cycle is generally checked continuously while generating metal connection wires to assure; there is zero odd cycle in the final routing layout. However, in an SADP router, given the complexity of SADP design rules and odd cycle check, it can be time consuming and may cause inaccuracies if the SADP odd cycles were continuously checked while generating metal connection wires. Instead of checking SADP odd cycles, circuit designers often perform circuit layout to assure that the circuit design is decomposable. One common SADP design restriction to assure decomposable SADP layout entails using discrete metal widths that are integer number factors of a default width. In examples of a default metal width of 24 nm, the allowed metal width will be 48 nm, 72 nm, 96 nm, 120 nm, etc.

Another common strategy to comply with SADP rules entails uni-directional application of features on grid design, as illustrated in FIG. 1P. FIG. 1P depicts a simplistic example of a prior art circuit layout, e.g., a plurality of metal lines 52 that are to be formed using an SADP process. The metal lines 52 may be representative of metal lines that are to be formed in the metal-2 (M2) layer of an integrated circuit product. The dotted lines in FIG. 1P may be metal routing tracks may have alternating color assignments. The uni-direction on grid design however imposes further restriction on metal width as will be clarified below.

FIG. 1Q depicts a simplistic example of a prior art circuit layout, e.g., a plurality of metal lines 52, 56, 58 that are to be formed using an SADP process. The metal lines 52, 56, 58 may be representative of metal lines that are to be formed in the metal-2 (M2) layer of an integrated circuit product. The metal lines 52, 56, 58 are arranged on various tracks ("M2 tracks"), as depicted in dashed lines in FIG. 1Q. As it relates to the SADP process, the metal lines 52, 56, 58 may be divided into mandrel-metal lines and non-mandrel-metal lines. In the depicted example, the mandrel-metal lines are arranged on the M2 tracks with the "0" designation, while the non-mandrel-metal lines are arranged on the M2 tracks with the "1" designation.

In the depicted example, the metal line 52 has a critical dimension or width 53 and they have a pitch 51. The metal line 55 has a critical dimension of 56, and the metal line 57 has a critical dimension of 58. In some applications, SADP metal design rules require that a minimum different color (DC) pitch be 48 nm. The minimum DC spacing would then be 48 nm minus 24 nm, thus 24 nm. The minimum same color (SC) pitch in this case is 96 nm, thus the same color spacing would be 72 nm (i.e., 96 nm-24 nm). In SADP applications, metal widths are generally required to be integer times the minimum width, e.g., 24 nm. In the example of FIG. 1Q, the metal line 55 may be 72 nm, and the metal line 57 may be 168 nm.

Generally, an SADP metal wire design that occupies an even number of tracks is prone for decomposition violations. As shown in FIG. 1R, the metal wires that occupy even number of tracks (2, 4, 6, . . . ) will cause violations of decomposition rules. As shown in FIG. 1R, if a default metal wire feature (minimum metal width) is used, such as a 24 nm metal feature (53A) using color 1 (NMM), with a spacing 59 of 72 nm spacing followed by a 72 nm metal feature (53B), followed by a 24 nm spacing and a subsequent 24 nm metal feature (53C) of color 1 (NMM), the problem is metal features 53A and 53B have to be of the same color, and 53B and 53C have to be different color according to SADP design rules as shown in FIG. 1M. Therefore, no matter which color is assigned to the center metal feature (53B), a decomposition violation will occur since there exists consecutive same-color metal features, which would cause color spacing violation(s). Accordingly, the design of FIG. 1R would be forbidden by the SADP decomposition rules.

To prevent the risk of SADP decomposition error in SADP design, such as SADP routing, a metal line must occupy an odd number of M2 tracks in order to comply with SADP decomposition rules which in some examples have to be 24 nm, 120 nm, 216 nm, etc. This width restriction makes circuit design very difficult at least because the flexibility of providing metal width larger than the minimum width is desirable to reduce IR drop and improve clock skew and latency.

The present disclosure is directed to various methods of generating circuit layouts that are to be formed using self-aligned double patterning (SADP) techniques which may solve or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of generating circuit layouts that are to be formed using self-aligned double patterning (SADP) techniques. In one embodiment, a method is disclosed herein that is directed to the design and manufacture of reticles that may be employed in semiconductor manufacturing. Such a method involves, among other things, creating an overall pattern layout for an integrated circuit that is to be manufactured using a self-aligned double patterning (SADP) process, forming a first metal feature having a first width on a first track of a metal layer using the SADP process, forming a second metal feature having a second width on a second track of the metal layer. The second track is adjacent to the first track using the SADP process. The method also includes forming an electrical connection between the first metal feature and the second metal feature to provide an effectively single metal pattern having a third width that is the sum of the first and second widths, rendering the first and second features decomposable using the SADP process; and decomposing the overall pattern layout with the first and second metal features into a mandrel mask pattern and a block mask pattern.

BRIEF DESCRIPTION OF THE DRAWINGS

The disclosure may be understood by reference to the following description taken in conjunction with the accompanying drawings, in which like reference numerals identify like elements, and in which:

FIGS. 2A-2H depict various illustrative embodiments of various methods disclosed herein of decomposing circuit layouts that are to be formed using self-aligned double patterning (SADP) techniques;

Figure 1A:
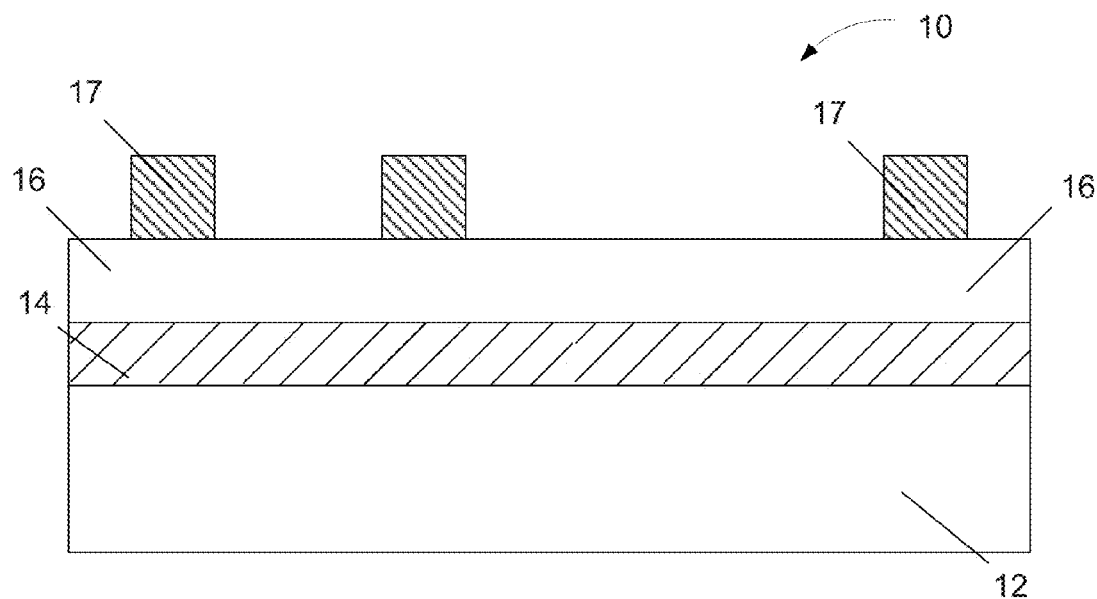
FIGS. 1A-1K, 1N, and 1P-1R depict one illustrative example of a prior art SADP process.
Figure 1B:
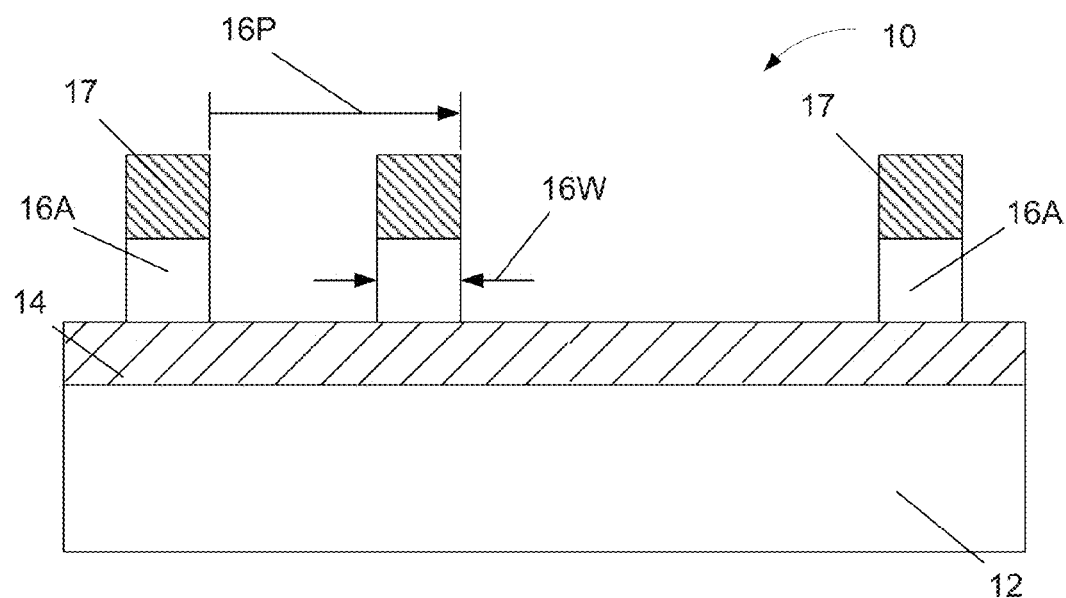
Figure 1C:
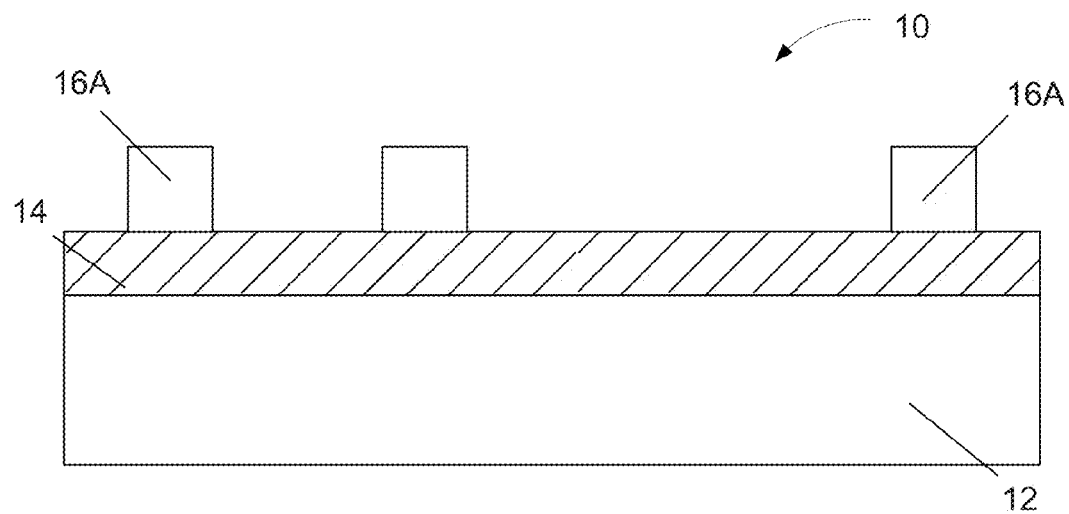
Figure 1D:
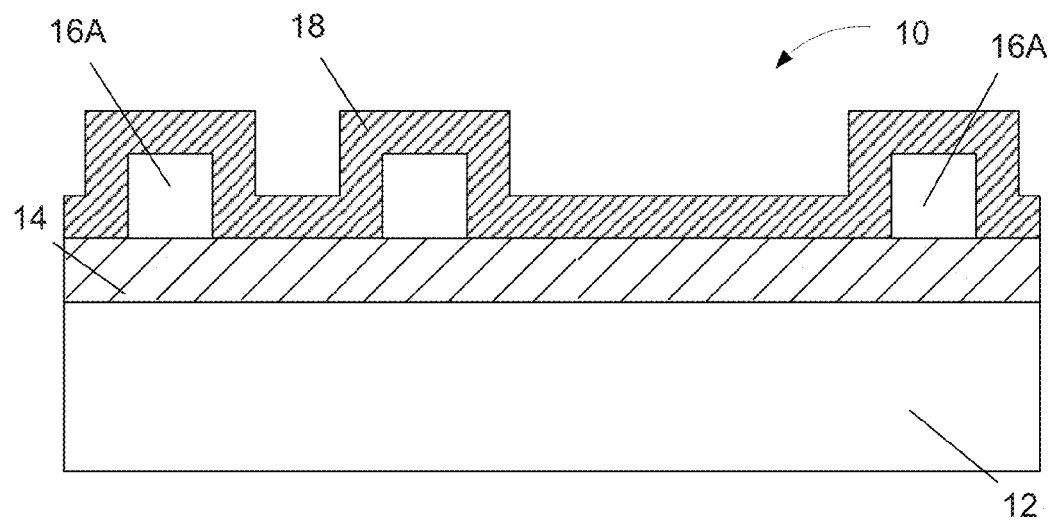
Figure 1E:
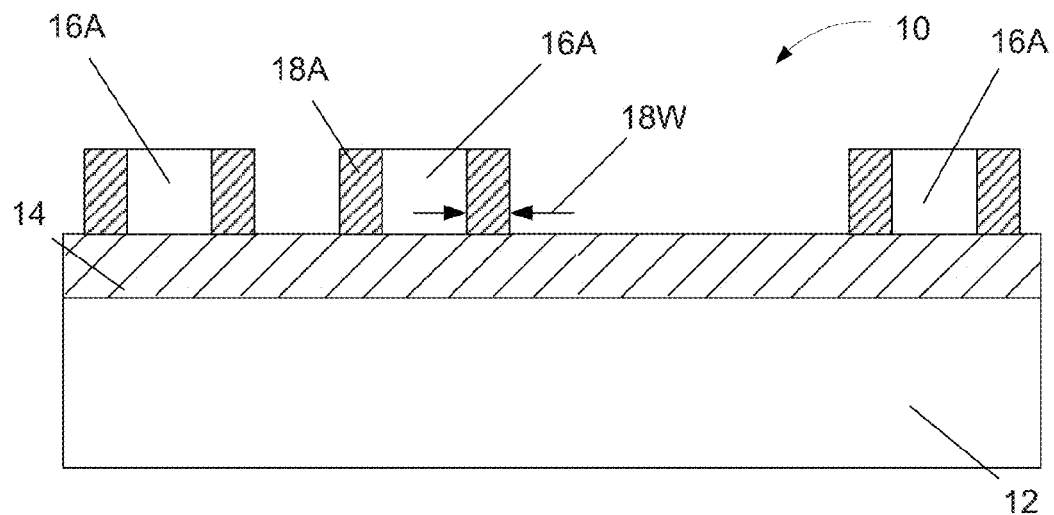
Figure 1F:
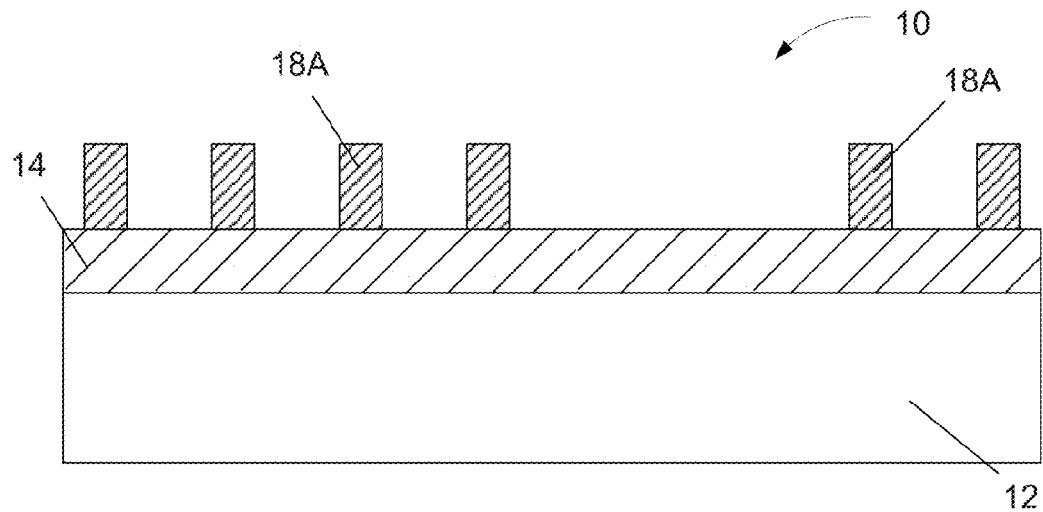
Figure 1G:
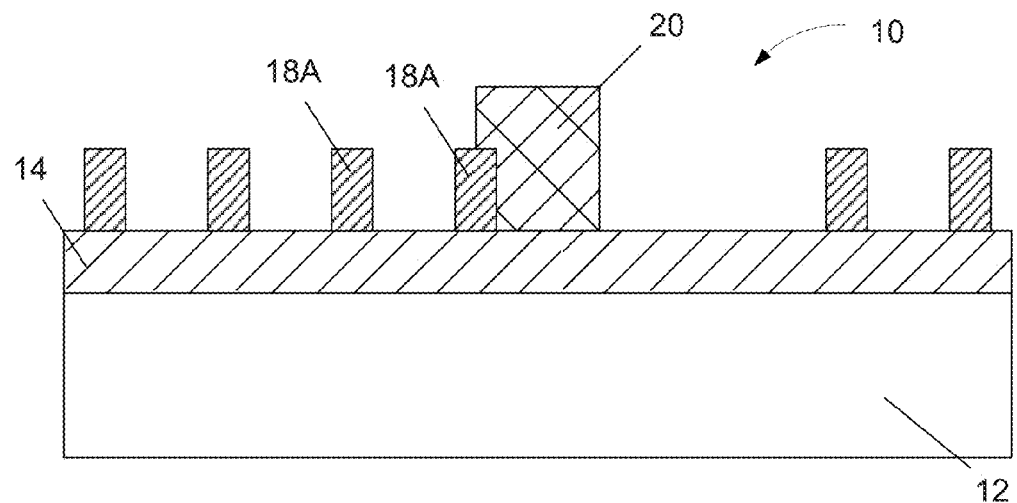
Figure 1H:
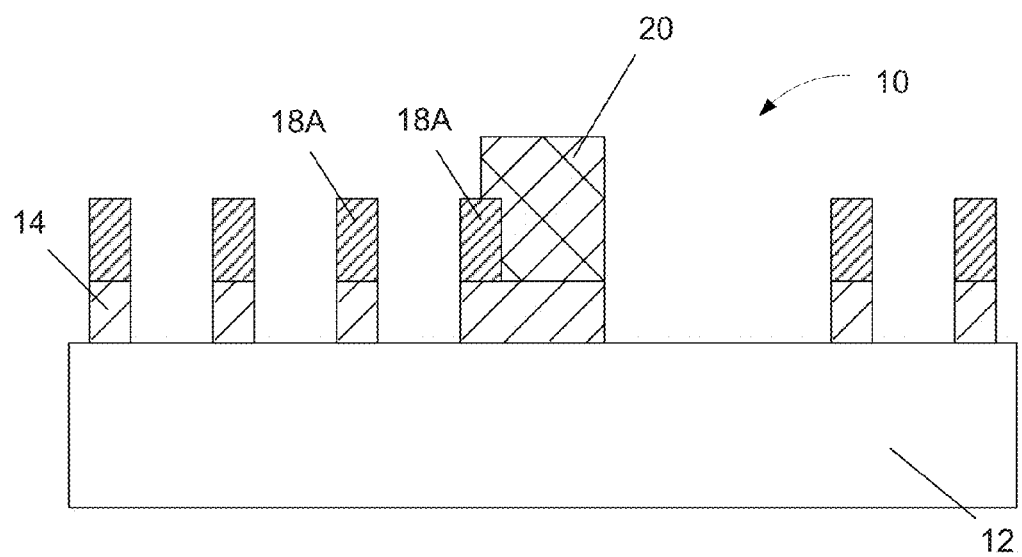
Figure 1I:
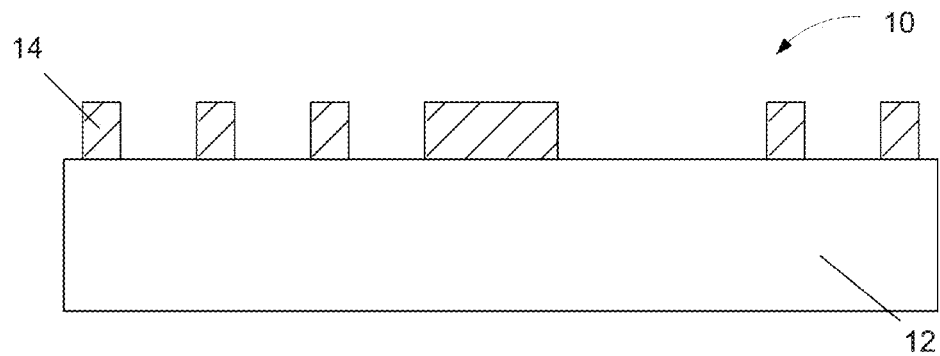
Figure 1J:
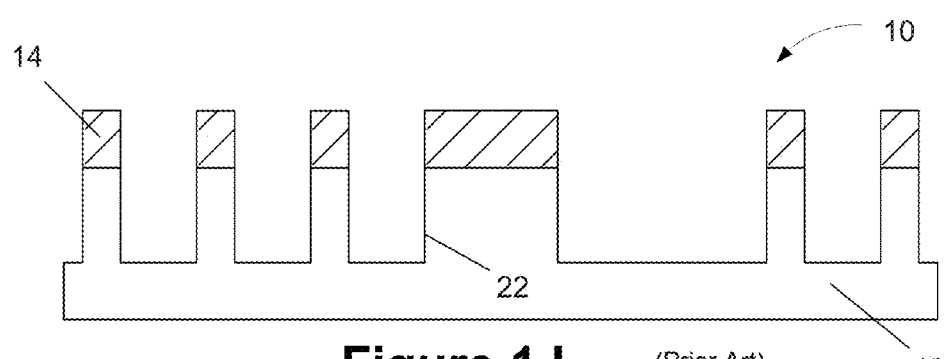
Figure 1K:
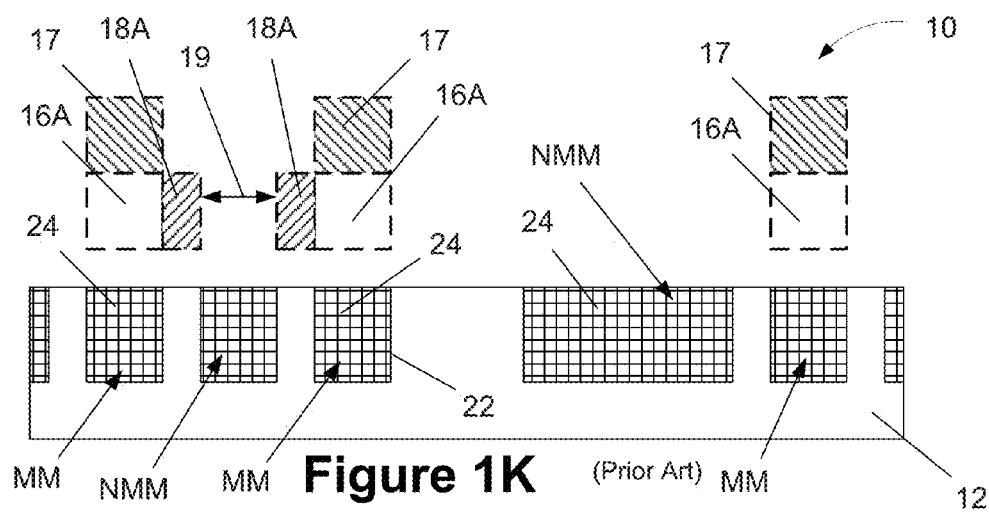
Figure 1L:
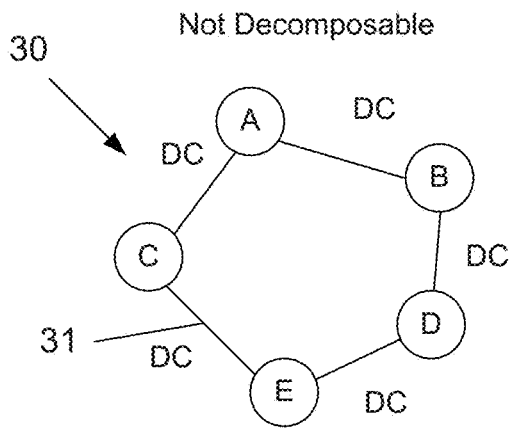
FIGS. 1L-1M depict illustrative examples of polygon loops and one example of resolving an odd-cycle conflict in a LELE process.
Figure 1N:
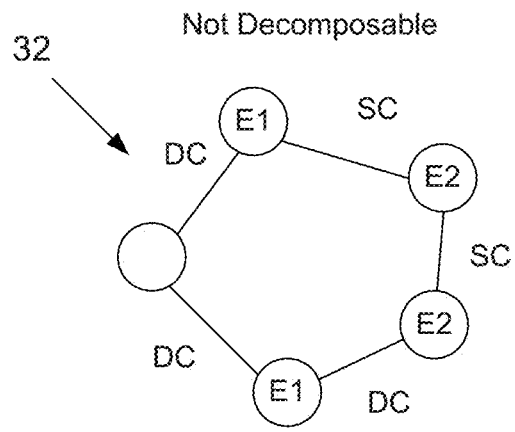
Figure 1M:
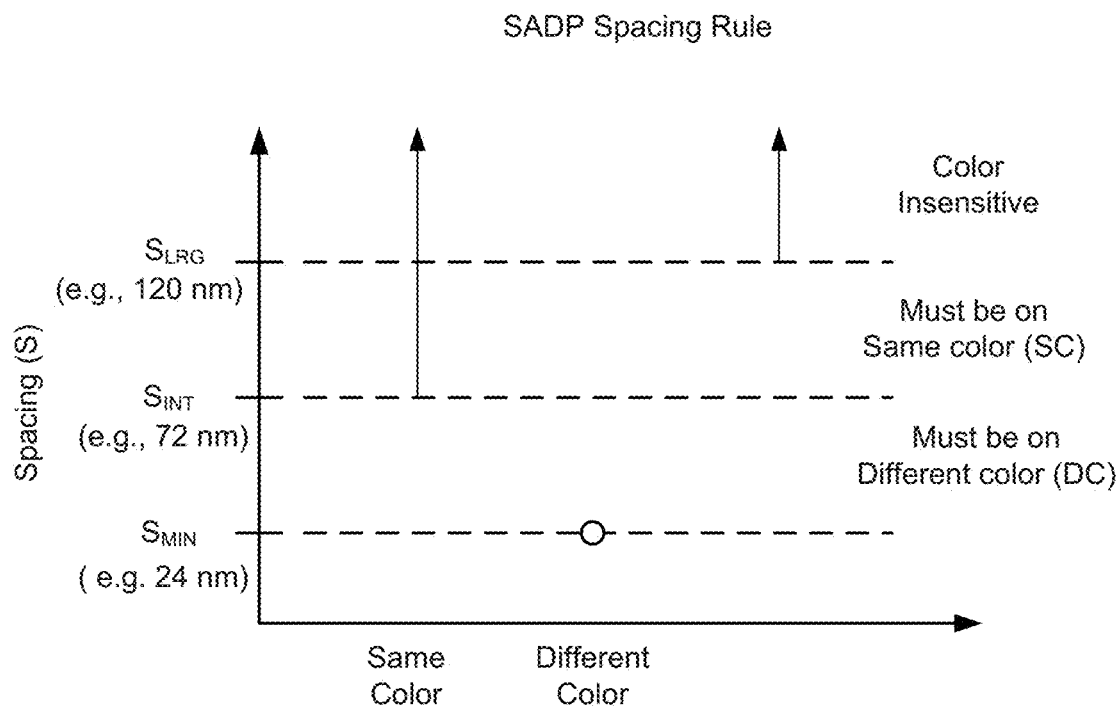
Figure 1P:
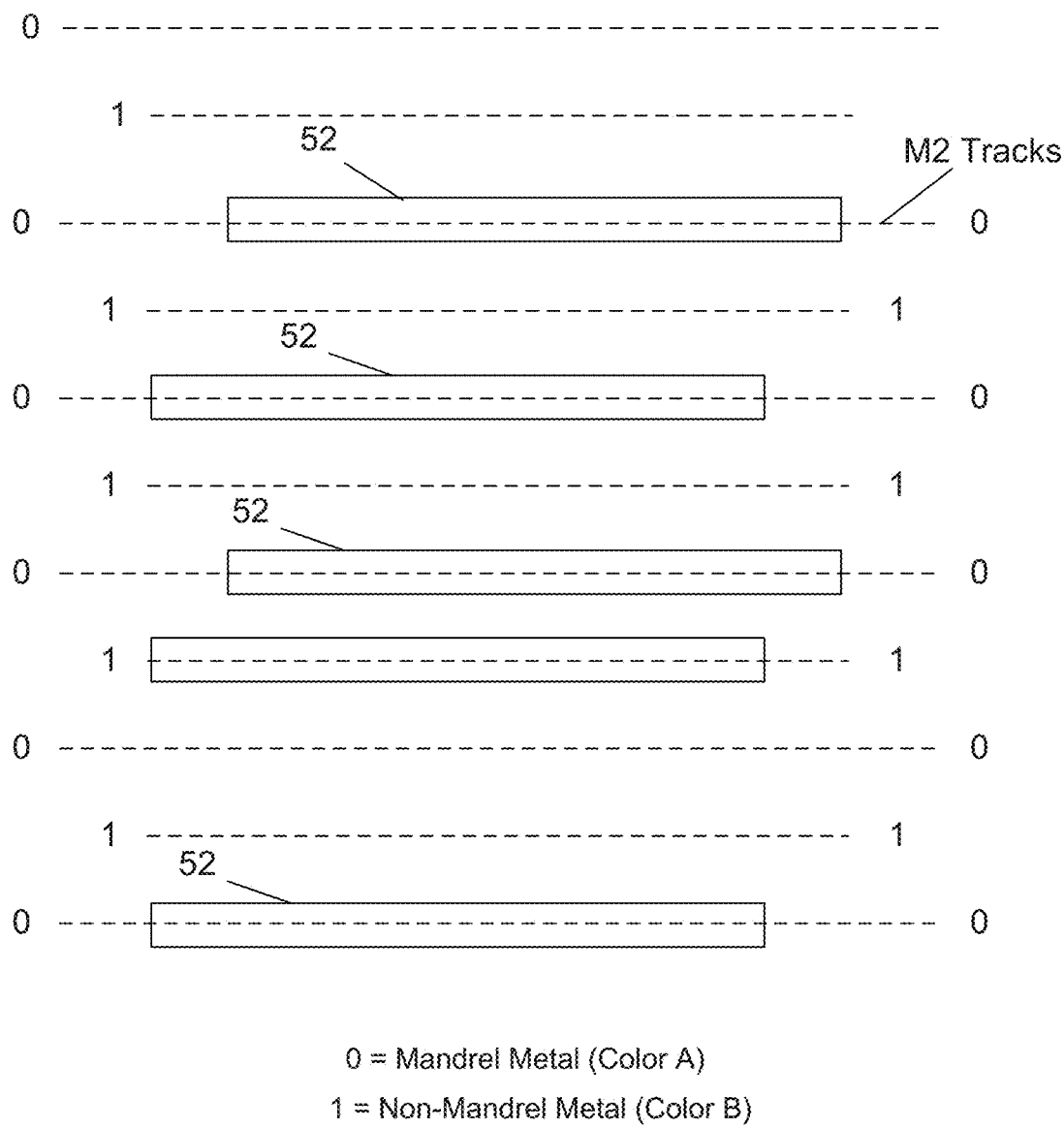
Figure 1Q:
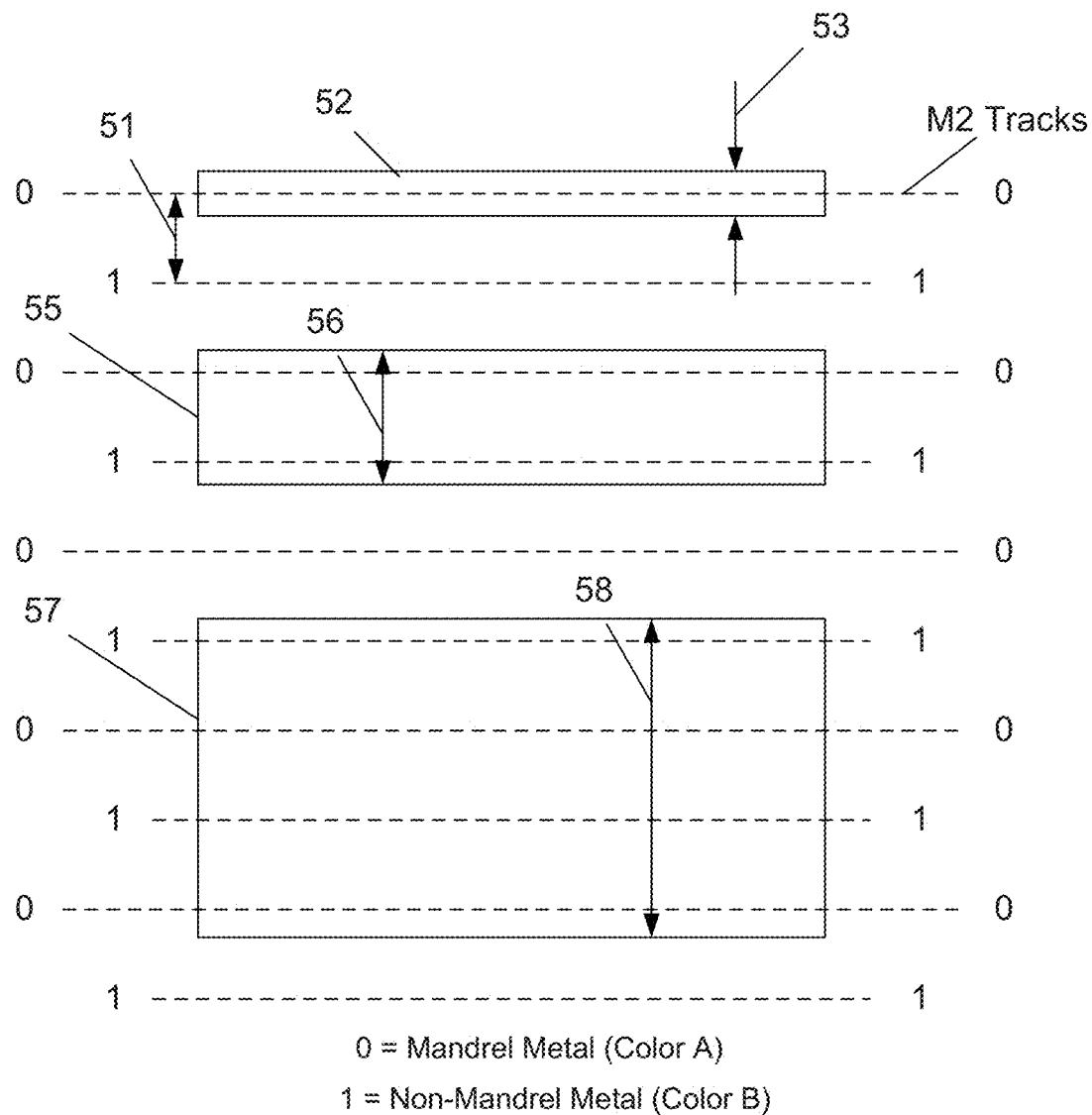
Figure 1R:
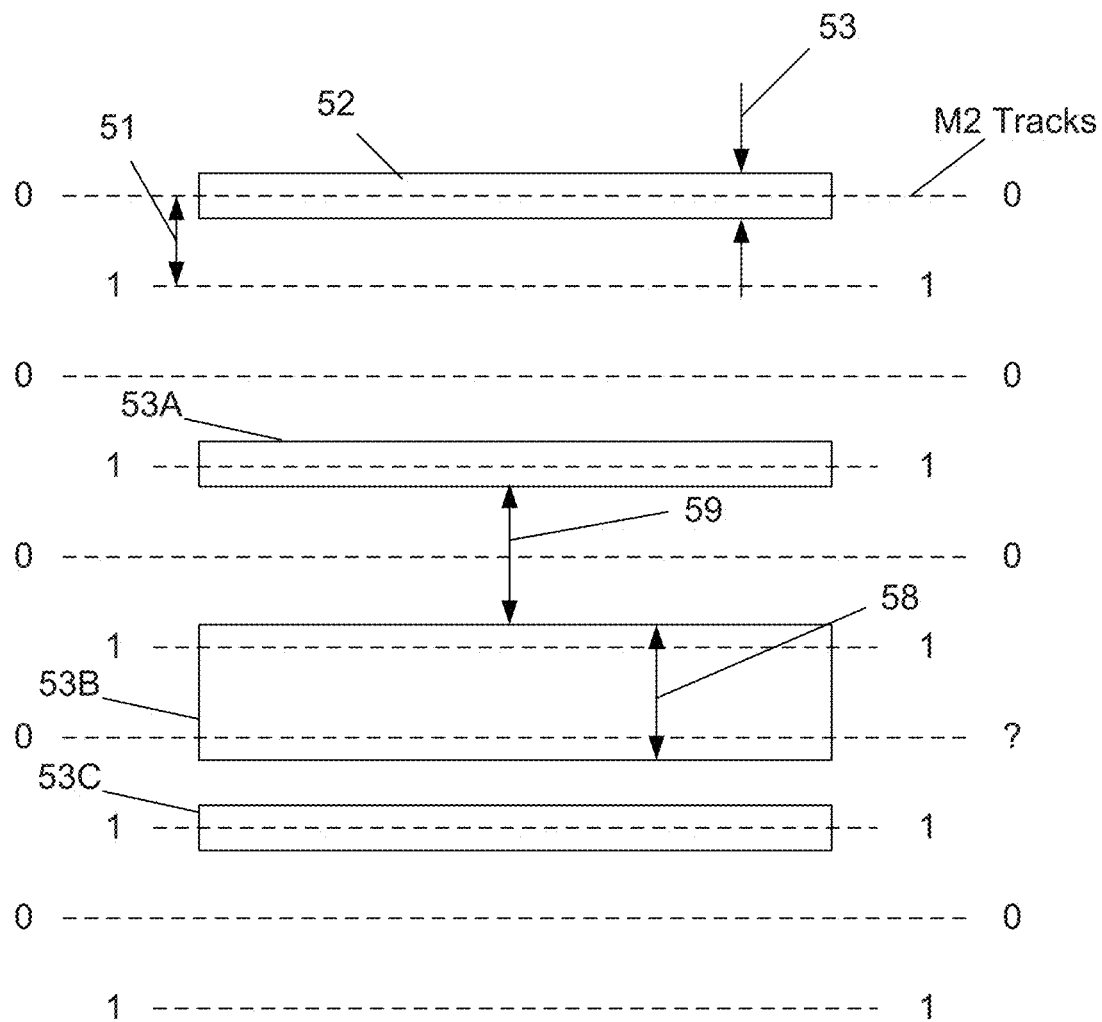

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is generally directed to various methods of creating circuit layouts that are to be formed using self-aligned double patterning (SADP) techniques. As will be readily apparent to those skilled in the art upon a complete reading of the present application, the methods and devices disclosed herein may be employed in the fabrication of a variety of devices, such as logic devices, memory devices, ASICs, etc. With reference to the attached figures, various illustrative embodiments of the methods, devices and systems disclosed herein will now be described in more detail.

Generally, in some SADP processes, larger metal widths tent to be integer multiples of a minimum width. For example, in an SADP process that has an exemplary minimum metal widths of 24 nm, larger metal widths would be integer multiples of the minimum width (e.g., 48 nm, 96 nm, etc.). In SADP processes, metal lines are arranged in such manner that mandrel metal ("0") and non-mandrel metal ("1") lines alternate. Embodiments herein provide for using two separate metal features carrying the same signals that would result in an effectively wider metal feature.

FIG. 2A-2H will be referenced to discuss various aspects of the inventions disclosed herein. Reference will also be made to certain aspects of the prior art process flow described in FIGS. 1A-1M as needed. As indicated in the background section of this application, in an SADP process, the features that are formed, e.g., metal lines, are either mandrel-metal features (MM) or non-mandrel-metal (NMM) features. As it relates to terminology used herein and in the attached claims, the MM features and NMM feature are referred to as being different "colors" when it comes to decomposing an overall pattern layout that is to be manufactured using an SADP process technique. Thus, two MM features are said to be of the "same color," while an MM feature and an NMM feature are said to be of "different colors." Similarly, two NMM features are said to be of the "same color."

Figure 2A:
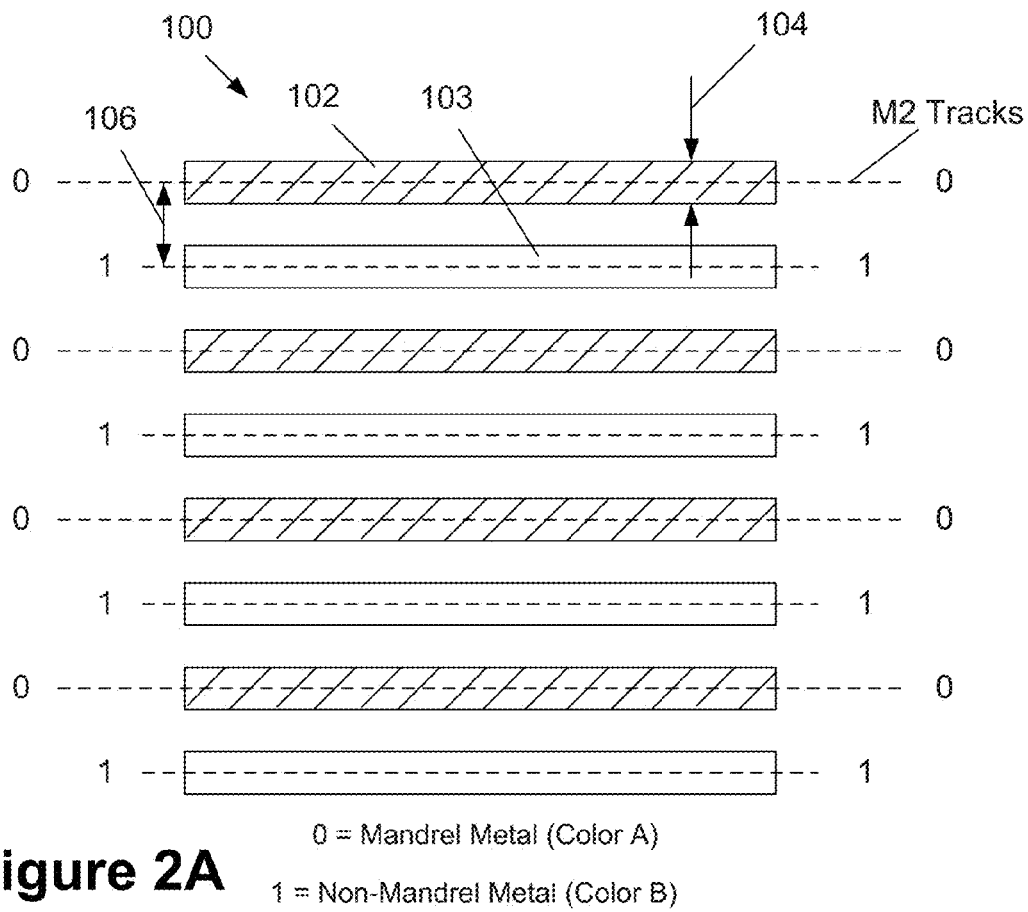

FIG. 2A depicts a simplistic example of a circuit layout, e.g., a plurality metal lines 100 that are to be formed using an SADP process. The metal lines 100 may be representative of metal lines that are to be formed in the metal-2 (M2) layer of an integrated circuit product. The metal lines 100 are arranged on various tracks ("M2 tracks"), as depicted in dashed lines in FIG. 2A. As it relates to the SADP process, the metal lines 100 may be divided into mandrel-metal lines 102 and non-mandrel-metal lines 103. In the depicted example, the mandrel-metal lines 102 are arranged on the M2 tracks with the "0" designation, while the non-mandrel-metal lines 103 are arranged on the M2 tracks with the "1" designation. In the depicted example, each of the metal lines 100 has a critical dimension or width 104 and they have a pitch 106. The magnitude of the width 104 and the pitch 106 may vary depending upon the particular application, and these dimensions will likely decrease as device dimensions continue to shrink as technology advances. In one example, the metal lines 100 may have a target width 104 of 24 nm and a target pitch 106 of 48 nm. However, as will be appreciated by those skilled in the art after a complete reading of the present application, the various inventions disclosed herein have broad applicability and they may be employed when manufacturing features having any desired configuration, pitch or width. Thus, the present inventions should not be considered to be limited to any of the illustrative numerical examples referenced herein, as those examples are only provided so as to facilitate an understanding of the presently disclosed inventions.

Figure 2B:
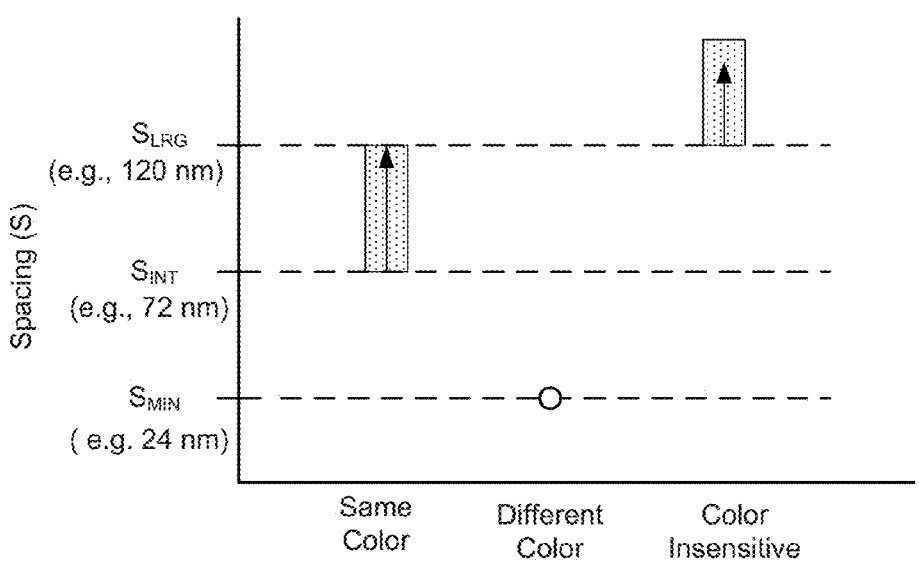

With reference to FIG. 2B, various other aspects of an SADP process will now be discussed. In general, in an SADP process the minimum width or critical dimension of a mandrel-metal feature is equal to the minimum width 16W of the mandrel 16A (see FIGS. 1B and 1K). On the other hand, the minimum width or critical dimension of a non-mandrel-metal feature is equal to the spacing between two mandrels 16A less twice the spacer width 18W. See FIGS. 1B and 1E. (See dimension 19 in FIG. 1K.) FIG. 2B graphically depicts various "coloring rules" for an SADP process wherein the minimum width 16W of the mandrels 16A is 24 nm, the minimum width 18W of the spacers is 24 nm and the pitch 18P of the mandrels 16A is 96 nm.

With continuing reference to FIG. 2B, if the spacing between adjacent features is 24 nm ($S_{MIN}$), then those two features must be formed with different colors where one feature is a mandrel-metal (MM) feature and the other feature is a non-mandrel-metal (NMM) feature. The spacing of larger than 24 nm and less than 72 nm is prohibited by generally SADP design rule. When the spacing between features is greater than or equal to 72 nm ($S_{INT}$) and less than 120 nm, those features must be formed using the same color mask. If the spacing between the adjacent features is greater than 120 nm ($S_{LRG}$), then the features are insensitive to "color" and may be formed using any mask. Note that in the case where the adjacent features are spaced apart by a distance equal to 72 nm, and up to but not including 120 nm, those features must be formed using the same color mask, i.e., both features are MM features or both features are NMM features. That is, for the condition where $S_{INT} \leq S < S_{LRG}$, then the adjacent features must be formed using the same color mask.

FIG. 2C exemplifies a non-decomposable arrangement wherein FIG. 2D illustrates a decomposable arrangement. More specifically, FIG. 2C depicts an example of a polygon loop 140 drawn for five (A-E) adjacent features that are part of a circuit pattern that is to be manufactured using an SADP process. The polygon loop 140 is comprised of five edges. In this example, due to the relative spacing between adjacent features A-C-E, and D, those four adjacent features have to be formed using "different color" ("DC") masks. Thus, the polygon loop 140 has three "DC" edges connecting those four features. The spacing between the feature B and its adjacent features A and D is such that the features A and B must be formed using the "same color" ("SC") mask and the features B and C must be formed using the same color mask. In one particular example, the features A and B in the polygon loop 140 may be spaced apart by a distance equal to 72 nm and up to but not including 120 nm, the condition where $S_{INT} \leq S < S_{LRG}$. Thus, the polygon loop 140 represents an odd-cycle layout due to the odd number of DC edges (three total) in the polygon loop 140. Accordingly, due to the odd number of DC edges in the polygon loop 140, the pattern reflected by the polygon loop 140 is not decomposable and therefore cannot be manufactured using SADP techniques.

As illustrated in FIG. 2D, the pattern represented by the non-decomposable polygon 140 in FIG. 2C may be changed to a decomposable pattern 140A using double patterning techniques. More specifically, in one embodiment disclosed herein, the spacing between adjacent features (e.g., A-B) that had to be formed using the same color mask is decreased so as to force the features (with the decreased spacing therebetween) to be formed using different color (DC) masks. For example, the spacing between the features A and B may be decreased to $S_{MIN}$, e.g., 24 nm, in the example discussed herein, to thereby force the features A and B to be formed using different color masks and thus change an odd cycle loop (3 DC edges) into an even cycle loop (4 DC edges). Effecting such a change in spacing may be accomplished using several techniques. In the example depicted in FIG. 2D, the decrease in spacing between the features A and B may be accomplished by treating one edge 110 of the feature A as being fixed and moving another edge 112 of the feature A toward the feature B. In this example, the position of the edges of the feature B remain unchanged and only feature A is modified. Stated another way, the size of the feature A is increased while the size of the feature B remains unchanged.

Importantly, using the methods disclosed herein, an otherwise non-decomposable pattern may be converted to a decomposable pattern without affecting the spacing relationship between other adjacent features or any area penalty. FIGS. 2E and 2F are side by side layouts of a portion of a non-decomposable circuit pattern (FIG. 2E) and a decomposable circuit pattern (FIG. 2F) that will be referenced to explain this point. In FIGS. 2E and 2F, the spacing 114 between the features C and A, as well as the spacing 116 between the features B and D remain unchanged. However, using the methods disclosed herein, the spacing between the features A and B was decreased to $S_{MIN}$, e.g., 24 nm (compare FIGS. 2E and 2F), to thereby force the features A and B to be formed using different masks. In the particular example depicted in FIG. 2F, the decrease in spacing between the features A and B was accomplished by changing the size of both of the features A and B. More specifically, one edge 110 of both of the features A and B was treated as being fixed, while the facing edges 112 of the features A and B were moved toward one another. In this example, the position of the edges of both of the features A and B were modified. Stated another way, the size of both of the features A and B were increased to reduce the spacing between the features A and B.

Figure 2G:
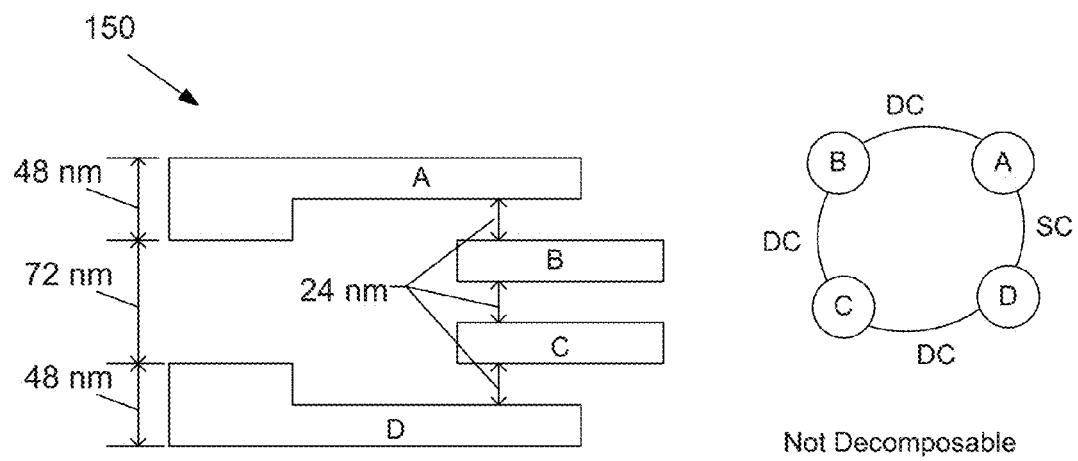
Figure 2H:
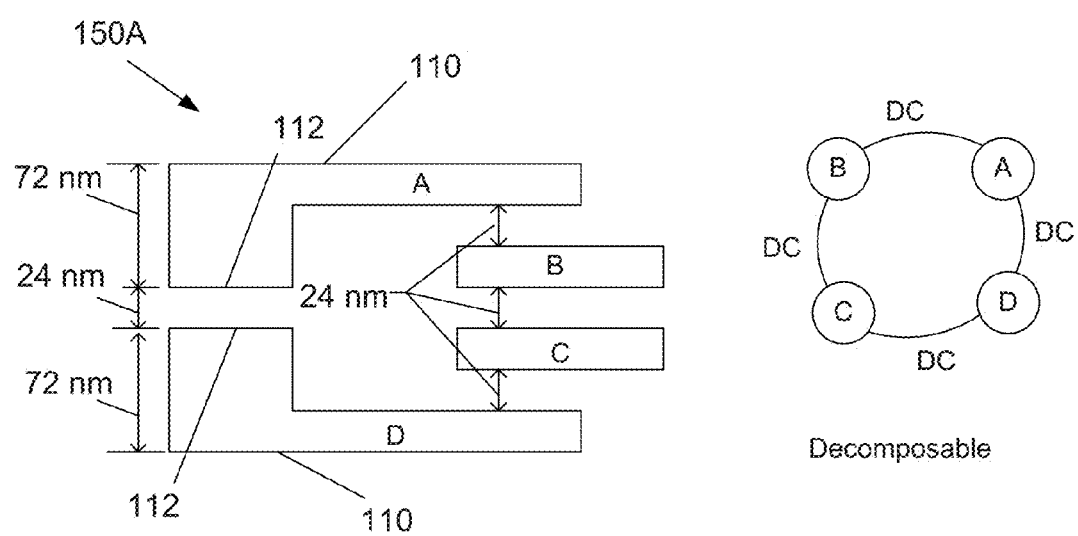

FIGS. 2G-2H provide another example of a pattern layout that may be transformed from a non-decomposable layout to a decomposable layout using the methods disclosed herein. Again, the numbers set forth herein are for purposes of illustration only. In the pattern 150 shown in FIG. 2G, there are four (A-D) adjacent features that are part of a circuit pattern that is to be manufactured using an SADP process. The polygon loop is comprised of four edges. In this example, due to the relative spacing between adjacent features A-B, B-C and C-D, those three features have to be formed using "different color" ("DC") masks. Thus, the polygon loop has three "DC" edges connecting those four features. The spacing (72 nm) between the feature D and its adjacent feature A is such that the features A and D must be formed using the "same color" ("SC") mask. Thus, the pattern 150 represents an odd-cycle layout due to the odd number of DC edges (three total) in the polygon loop. Accordingly, the pattern 150 is not decomposable and therefore cannot be manufactured using SADP techniques.

FIG. 2H depicts an example wherein the size of both of the features A and D are increased to resolve the coloring conflict by forcing the features A and D to be formed using different color (DC) masks. More specifically, in this example, the outside edges 110 of both of the features A and D were treated as being fixed, while portions of the facing edges 112 of both of the features A and D were moved toward one another until the spacing was decreased to 24 nm. Having made this spacing change, the pattern 150A is now decomposable since the polygon has four DC edges.

In some embodiments, wider metal features may be used to for producing metal lines with reduced resistivity, resulting in lower IR drops in voltage supplies. Further, when using a metal feature to carry clock signals, a wider metal feature may provide for reduced clock latency. Embodiments herein provide for an effectively wider feature for a metal wire using two separate metal features carrying the same signals. In this case, more metal width options can be provided with substantially no risk of decomposition violation.

FIGS. 3A-3E will be referenced to discuss various aspects of the metal features in accordance with some embodiments of the inventions disclosed herein. As noted above, in many cases, flexibility for providing metal lines with widths that wider than the default line widths are desirable to reduce various problems, such as IR drop and/or clock latency. As noted above, using metal wires that occupy even number of tracks (2, 4, 6, . . . ) may cause violations of decomposition rules and the minimum non-default metal width must generally occupy odd number tracks in order to comply with SADP decomposition rules. Assuming an exemplary minimum metal width of 24 nm and a minimum metal pitch of 48 nm, the valid metal wires that do not violate decomposition rules are required to be 24 nm, 120 nm, 216 nm, etc., which may be too restrictive for circuit design. In order to address these problems, in accordance with some embodiments, metal wires that would otherwise occupy an even number of tracks may be divided into two separate metal wires separated by a minimum space of 24 nm, that would be connected to the same signal. Since the two separate metal wires carry the same signal, they effectively provide alternate metal widths.

Figure 3A:
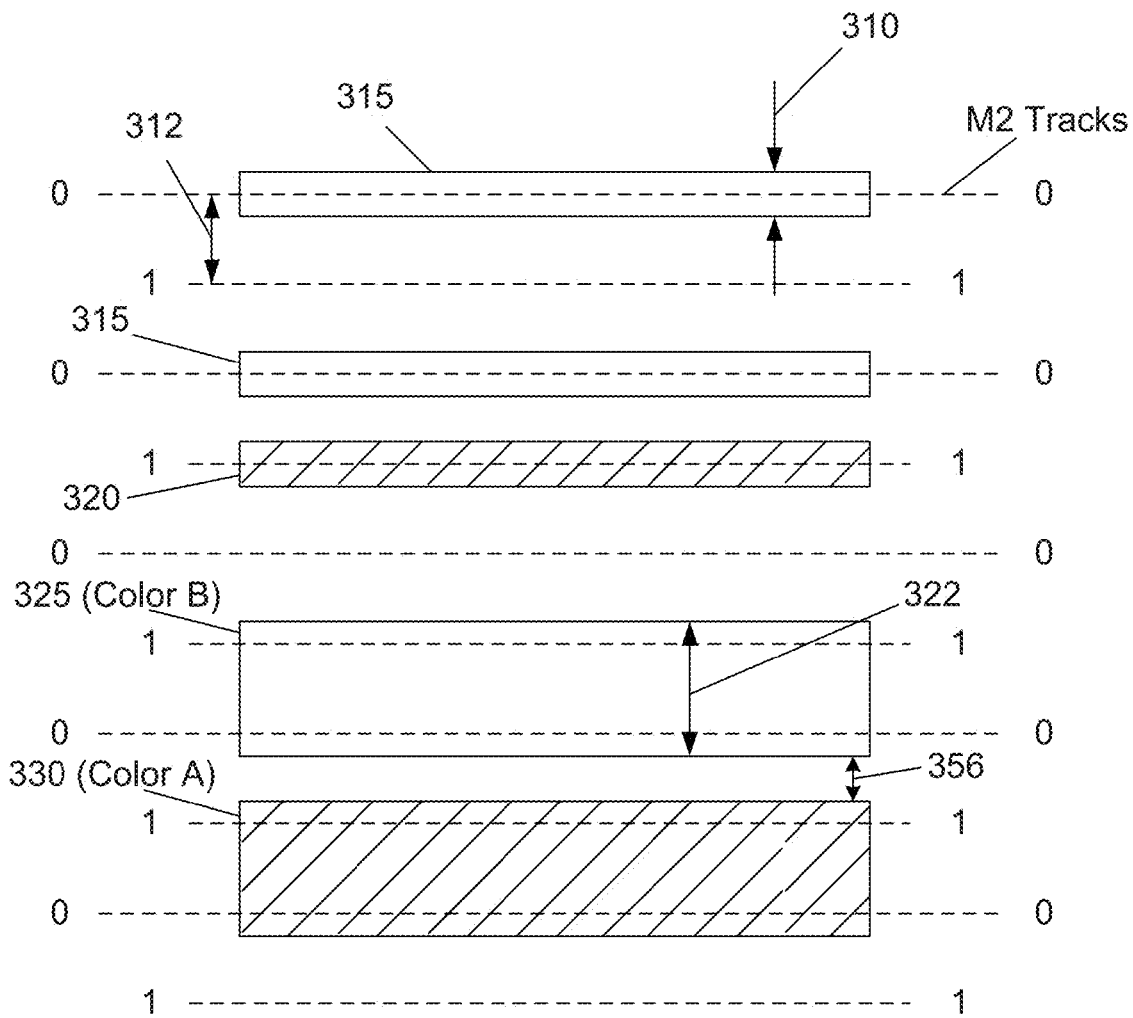
FIG. 3A-3B depict illustrative embodiments of various methods disclosed herein of decomposing metal lines that are to be formed using self-aligned double patterning (SADP) techniques.
Figures 3B, 3C:
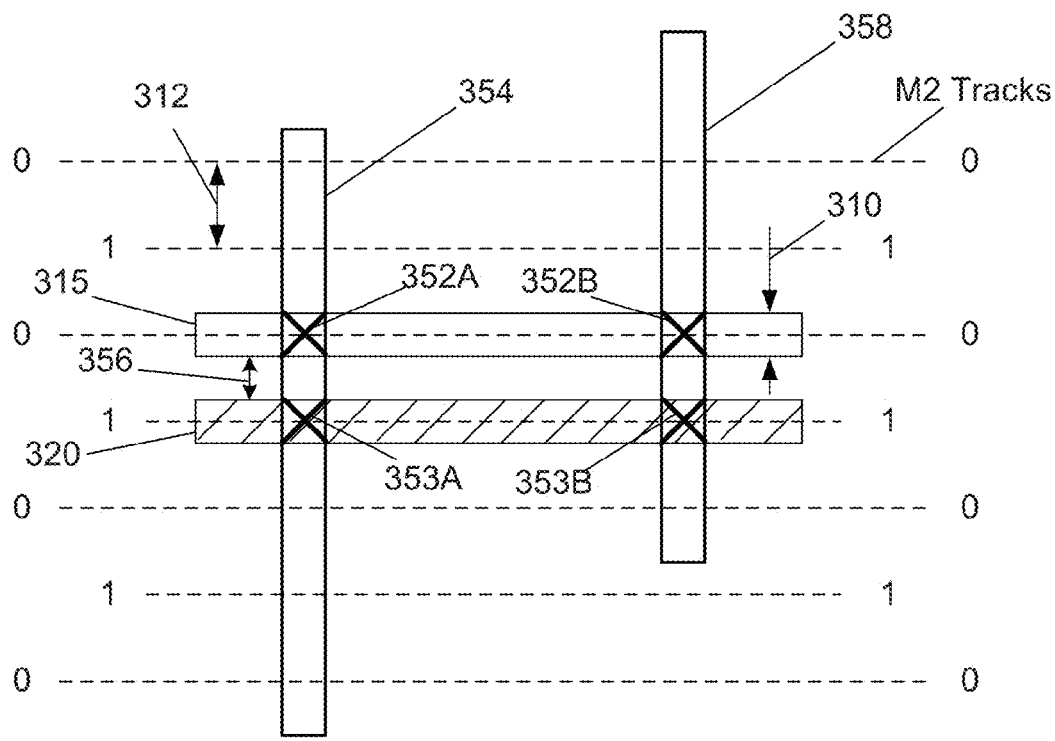
FIG. 3C depicts a table illustrating exemplary effective metal widths based upon number of tracks with respect to SADP techniques.

FIG. 3A illustrates an exemplary layout of metal lines in accordance with song embodiments provided herein. FIG. 3A illustrates a M2 metal line 315 that is of a default width 310 (e.g., 24 nm), with a default pitch of 312 (e.g., 48 nm). In some embodiments, a non-default metal line of twice the default width (e.g., 48 nm) may be desired, e.g. for a power rail or a clock signal. In order to comply with SADP decomposition rules, two metal lines of default width may be used, while the same signal if provided to both lines. The metal lines 315 and 320 represent such a configuration. In one embodiment, both of the M2 metal lines may be connected to the M1 metal pin (as shown in FIG. 3B). Since they are connected to the same signal, the metal lines 315 and 320 together effectively provide a wider metal signal line of twice the default width. In the example of a default width of 24 nm, the metal lines 315 and 320 provide an effective metal signal line of 48 nm. Further, this is accomplished by using only two M2 tracks, while remaining in appliance with SADP decomposition rules.

The metal pattern pairs, as exemplified in FIG. 3A, that are formed next to each other are decomposable under the SADP decomposition rules. Therefore, even wider metal line pairs can be used together and provide higher effective metal widths, while using less tracks compared to normal SADP non-paired configurations. That is, if metal wires that span even number of tracks are desired, using a pair of metal lines that carry the same signal may be used to provide metal lines that are wider than default widths and remain in compliance with the SADP rules.

As shown in FIG. 3A, metal lines 325 and 330 may be used as a pair that carry the same signal and remain in compliance with SADP decomposition rules while using an even number of tracks. The metal line 330 is of color A and the metal line 325 is of Color B. The metal lines 325 and 330 each may have a width of 322 (e.g., 72 nm). The metal line pair (325 and 330) are separated by a space 356, which in one embodiment, is the minimum different color (DC) space as determined by the spacer thickness.

When the same signal is provided to both metal lines 325 and 330 of FIG. 3A, this pair of metal lines may effectively act as a single metal line of 144 nm. As such, the metal line pairs 315 and 320, as well as the metal line pairs 325 and 330, are decomposable in SADP processes. In one embodiment, the metal pairs illustrated in FIG. 3A is formed in such a manner that there would be virtually no risk in causing odd cycles, thereby saving the SADP router from having to check odd cycles and virtually assuring the decomposability of the layout. This may provide for enhancing the efficiency of the SADP routing process. In a similar manner, metal line pairs of other widths may be used to provide for metal lines of effectively larger widths, while remaining in compliance with SADP decomposition rules.

FIG. 3B illustrates one exemplary manner of providing the same signal to metal line pairs, in accordance with some embodiments. The M2 metal line 315 is of a default width 310 (e.g., 24 nm), with a default pitch of 312 (e.g., 48 nm). The metal line 320 is a similar metal line formed to be a part of a metal line pair. The metal line pair (315 and 320) are separated by the space 356, which in one embodiment, is the different color (DC) space as determined by the spacer thickness. In one embodiment, the metal pair (315 and 320) is formed in such a manner that there would be virtually no risk of causing odd cycles, saving the SADP router from checking for odd cycles and virtually assuring the decomposability of the layout.

When a same signal is applied to the metal line pair (315 and 320) of FIG. 3B, the pair may provide functionality of a single metal line that is effectively the width of the sum of the widths of metal line 315 and metal line 320. For example, when the same signal is applied to the metal line pair (315 and 320), the effective wider metal width effect may provide for a reduction in the IR drop of a signal, an improvement of clock skew problems, an improvement of clock latency problems, and/or the like.

In one embodiment, in order to apply the same signal to the metal line pair (315 and 320), the metal line pair (315 and 320) may be connected to a metal line 354 from another metal layer, e.g., a metal-3 (M3) layer. The connection to the M3 metal line 354 may be made using the vias 352A and 353A. In this manner, the metal lint, pair 315 and 320 carry the same signal (e.g., a power signal, a clock signal, etc.), while providing an effective metal line width that is greater than the default width, using only two M2 tracks and remaining in compliance with SADP rules.

FIG. 3B also illustrates another metal line 358, which may be from another metal layer, e.g., a metal-1 (M1) layer, and connected to the metal line pair (315 and 320). The connection to the M1 metal line 358 may be made using the vias 352B and 353B. Accordingly, the connections provide by the metal line 354 and the metal line 358 provide for the metal line pair (315 and 320) to carry the same signal, effectively operate as a wider, single metal line.

FIG. 3C illustrates an exemplary table of allowable metal line widths in accordance with some embodiments herein. Those skilled in the art would appreciate that the table of FIG. 3E is provided for the illustration of one example of an SADP process using a minimum default metal feature of 24 nm and a track pitch of 48 nm. Those skilled in the art would appreciate that the table of FIG. 3C may be modified for other default widths and pitches and remain within the scope of embodiments herein.

As exemplified herein, when two tracks (e.g., M2 tracks) are used to provide a metal line, using embodiment directed to same-signal metal pairs described herein, an effective metal width of 48 nm is provided. Using prior art methods described above, a metal line of 72 nm may be formed, however, such a metal line would be forbidden under SADP decomposition rules. In some embodiments, effective metal line widths of 48 nm using two tracks, 144 nm using four tracks, and 240 nm using six tracks may be for r ed using embodiments herein and remain in compliance with SADP decomposition rules. As indicated in FIG. 3C, using two, four or six tracks using prior art methods would be forbidden under SADP decomposition rules. In contrast, embodiments herein provide for using any number of tracks, including an even number tracks to provide effectively wider metal widths while complying with SADP decomposition rules.

Embodiments disclosed herein provide for forming smaller metal lines and grouping them as metal line pairs by connecting the pairs to the same signals. The metal line pairs being connected to the same signal provides for an effectively wider, single metal line. The effective wider metal width effect may provide for a reduction in the IR drop in a signal, a reduction of clock skew problems, a reduction of clock latency problems, etc.

Generally, metal lines formed using even tracks of a metal layer (e.g., a 72 nm metal line) may be prone to SADP odd cycles and layouts that are not decomposable. When metal lines are formed using even tracks of a metal layer, a router that decomposes the layout would be required to check odd cycle in routing, similar to the LELE routing described above. Performing this task in SADP process is less efficient due to the complexity of SADP design rules and SADP odd cycles. However, if even track metal wire are forbidden in SADP routing, decomposability is generally assured. In this case, the SADP router would not be required to check odd cycles. This may result in faster runtimes while decomposability is generally assured. However, this would have the disadvantage of fewer options with regard to the widths of the metal lines. Embodiments provided herein provides for reducing this disadvantage by utilizing metal lines pairs in the manner described above to provide for more options regarding the widths of the metal lines. Employing embodiments described herein, more effective metal line widths are provided while not equiping the SADP router to perform odd cycle check, maintaining the advantage of less runtime and decomposability assurances.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
creating an overall pattern layout for an integrated circuit that is to be manufactured using a self-aligned double patterning (SADP) process;
forming a first metal feature having a first width on a first track of a metal layer using said SADP process;
forming a second metal feature having a second width on a second track of the metal layer, the second track being adjacent to the first track using said SADP process;
forming a first electrical connection between the first metal feature and the second metal feature and a second electrical connection between the first metal feature and the second metal feature, wherein the first metal feature and the second metal feature are each continuous between the first electrical connection and the second electrical connection, to provide an effectively single metal pattern having a third width that is the sum of the first and second widths, rendering said first and second features decomposable using said SADP process;
decomposing said overall pattern layout with said first and second metal features into a mandrel mask pattern and a block mask pattern;
generating a first set of mask data corresponding to said mandrel mask pattern; and
generating a second set of mask data corresponding to said block mask pattern.

2. The method of claim 1, further comprising providing said first and second sets of mask data to a mask manufacturer.

3. The method of claim 2, further comprising manufacturing integrated circuit products using masks obtained from said mask manufacturer, wherein said masks were based upon said first and second sets of said mask data.

4. The method of claim 1, wherein said first and second metal features are both same-color features for a spacing between said first and second metal features that is greater than 24 nm.

5. The method of claim 4, wherein said first and second metal features are both at least one of mandrel-metal (MM) features or non-mandrel-metal (NMM) features.

6. The method of claim 4, wherein one of said first and second metal features is a mandrel-metal (MM) feature and the other of first and second metal features is a non-mandrel-metal (NMM) feature.

7. The method of claim 1, wherein forming an electrical connection between the first metal feature and the second metal feature comprising forming a first via between said first metal feature and a third metal feature and forming a second via between said second feature and said third metal feature.

8. The method of claim 1, wherein said first and second metal feature provide effectively a single clock wire.

9. The method of claim 1, wherein a distance between said first and second metal features is a minimum different color space.

* * * * *